United States Patent
Chang et al.

(10) Patent No.: US 10,740,521 B1
(45) Date of Patent: Aug. 11, 2020

(54) SYSTEM AND METHOD FOR LOCALIZED LOGIC SIMULATION REPLAY USING EMULATED VALUES

(71) Applicant: Avery Design Systems, Inc., Tewksbury, MA (US)

(72) Inventors: Kai-Hui Chang, North Andover, MA (US); Christopher S. Browy, Boston, MA (US)

(73) Assignee: Avery Design Systems, Inc., Tewksbury, MA (US)

( * ) Notice: Subject to any disclaimer, the term of this patent is extended or adjusted under 35 U.S.C. 154(b) by 0 days.

(21) Appl. No.: 16/365,645

(22) Filed: Mar. 26, 2019

Related U.S. Application Data

(60) Provisional application No. 62/648,491, filed on Mar. 27, 2018.

(51) Int. Cl.
*G06F 30/3312* (2020.01)
*G06F 30/30* (2020.01)

(52) U.S. Cl.
CPC .......... *G06F 30/3312* (2020.01); *G06F 30/30* (2020.01)

(58) Field of Classification Search
CPC .............................. G06F 33/3312; G06F 30/20
USPC .......................................... 716/106, 108, 113
See application file for complete search history.

(56) References Cited

U.S. PATENT DOCUMENTS

2014/0100841 A1     4/2014  Bures
2015/0278416 A1*  10/2015  Darbari ............... G06F 30/3312
                                                                716/108

* cited by examiner

*Primary Examiner* — Paul Dinh
(74) *Attorney, Agent, or Firm* — Loginov & Associates, PLLC; William A. Loginov

(57) ABSTRACT

A computer executable system and method analyzes a circuit design to extract a small set of signals for value collection using an emulator system. The collected signals are for specific purpose checkers such as assertions or interactive testbenches that are hard to emulate. A synthesizable monitor block is generated and added to the emulation environment to collect the signal value changes during emulation. The collected values are then used in localized logic simulation to perform the tasks that the original checkers intent to accomplish. This system leverages fast emulation speed and flexible logic simulation capabilities to perform the intended checker tasks much faster than using logic simulation alone.

15 Claims, 2 Drawing Sheets

SYSTEM AND METHOD FOR LOCALIZED LOGIC SIMULATION REPLAY USING EMULATED VALUES

RELATED APPLICATIONS

This application claims the benefit of U.S. Provisional Application Ser. No. 62/648,491, filed Mar. 3, 2018, entitled SYSTEM AND METHOD FOR LOCALIZED LOGIC SIMULATION REPLAY USING EMULATED VALUES, the entire disclosure of which is herein incorporated by reference.

FIELD OF THE INVENTION

The invention relates generally to integrated circuit design and, most particularly, to techniques for using logic simulation and emulation to accelerate verification of digital circuit designs.

BACKGROUND OF THE INVENTION

Logic simulation is one of the most commonly used method for verifying circuit designs. It produces circuit signal values based on the current circuit state and inputs. More specifically, logic simulation takes a circuit design and the given input patterns to calculate values that will be produced by the design code. For example, logic simulation for an AND gate with inputs 0 and 1 will produce 0 on its output. Simulating the same gate with inputs 1 and 1 will produce 1 on its output.

Values produced by logic simulation can then be used to check whether the circuit behaves according to the specification. This is typically done using checkers to verify the correctness of the design. Checkers sample circuit signal values and then determine if the values are correct. Two common types of checkers are assertions and reactive testbenches. An assertion encodes logic relationships among signals using predefined logic rules. Testbenches are typically written using behavior code. Logic simulation is flexible and can handle various types of checkers like assertions and behavior testbench that can be reactive. However, for large designs logic simulation can be exceedingly slow.

Because logic simulation can take considerable time to perform for large designs, emulation has been designed to address this issue. Emulation uses FPGAs to implement the design in hardware, and it can produce signal values based on inputs and design states orders of magnitude faster than logic simulation. However, signal value visibility inside the emulator system is typically limited, and only the primary outputs of the design can be directly observed.

Checkers used in a design, such as assertions, typically only need access to a small number of circuit signals. Even though only a small number of signals is needed, generating those signals using logic simulation still requires simulating most if not the whole design, which is slow. Emulation can quickly generate values for those signals. However, extracting those values from emulation and then use them for the checkers is either difficult or time consuming.

To address this issue, some checkers may be synthesized and emulated with the rest of the design. However, in practice only a small number of checkers can be synthesized, and adding them to emulation impacts performance adversely. As a result, those checkers are typically not used in emulation environments, which greatly reduces the chance to find bugs using emulation and hurts final design quality.

Another way to address this issue is to obtain internal signal values in an emulated design and use those values on the checkers. One way to obtain internal signal values is to stop functional clocks and use scan chains to scan out flipflop values inside the design. This method can obtain most flipflop values without additional hardware added to the emulator. However, it can be exceedingly slow due to the large number of cycles needed to scan values out.

Dedicated hardware for obtaining emulation values can be used instead of scan chains to improve value collection speed. For example, one solution adds channels to monitor flipflop values and send the signals out to a logic analyzer. Such special hardware can provide better performance than using scan chain. However, dedicated hardware increases cost of the emulation system. Additionally, how to efficiently and easily replay the obtained logic values on the checkers remain a big challenge.

SUMMARY OF THE INVENTION

The present application provides a system and method to overcome the technological problems of the prior art and to improve logic simulation of circuit design. This is achieved by first extracting signals that are used in the checkers and then generating a monitor block that can collect values of those signals during emulation. The monitor block is synthesizable and becomes part of the emulated design. During emulation, the monitor block collects signal values and send them to the emulation control software. The software then writes those values into a database. Finally, a logic simulation system reads those values back and replay the values on the checkers to perform the intended tasks.

In this way, the checkers can be exercised as if the whole design is simulated, which allows complicated non-synthesizable checkers to be handled in our proposed system. This can be referred to as logic replay using emulated values. To further improve the performance of logic replay, the present system and/or method forces all signals not involved in the checkers to constant values so that the simulator does not need to evaluate any signal value changes in the downstream logic of the replayed variables. In this way the user does not need to spend extra effort to separate checker code from design code for logic replay yet can still achieve high simulation speed. This is because the simulator only needs to simulate the checkers given that all other simulation events are suppressed by the forces that our innovation applies. With the technology of the present application, designers can easily rely on fast emulation speed to fully exercise design checkers to find design bugs. This will greatly reduce design verification time and considerably improve final design quality.

The present application overcomes the disadvantages of the prior art by providing a system and/or method that instructs the emulator to dump signal value changes only for the signals used in the checkers. The present system and/or method can then use logic simulation to replay the signal values only on the checkers and not the rest of the design, achieving much shorter overall runtime compared with using logic simulation alone on verifying the design using the checkers. This allows the use of checkers in an emulation environment in an efficient way.

BRIEF DESCRIPTION OF THE DRAWINGS

For a more complete understanding of the invention, reference should be made to the following detailed descrip

DETAILED DESCRIPTION

Figure 1:
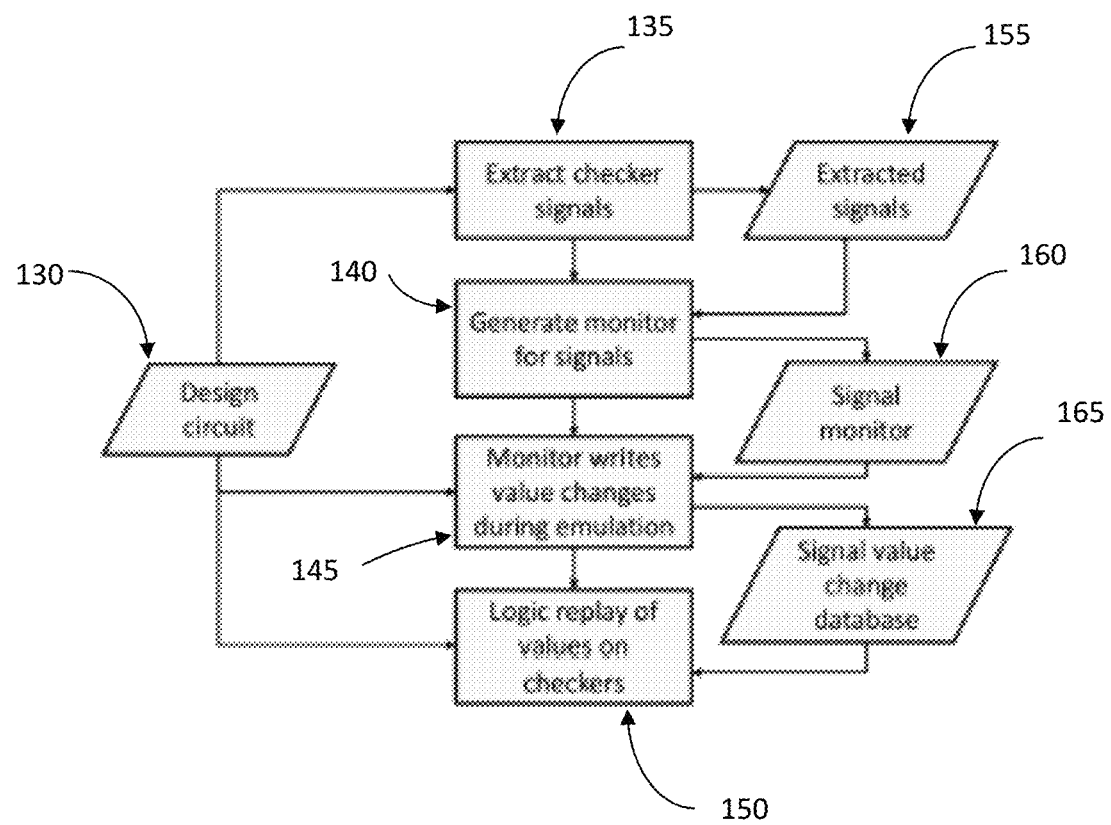
- FIG. 1 is a flow chart depicting to method to use emulation values for localized logic replay.

One goal of the present application is to first collect emulation values for signals used in design checkers and then use logic simulation to replay the collected values on the checkers to perform their intended tasks. The following steps achieve this goal, with FIG. 1 depicting a flow chart for collecting emulation values and replaying the collected values according to one or more aspects of the disclosure.

(1) A computer executable tool analyzes design code (130) and extracts signals (135, 155) used in checkers that the user intends to replay using logic simulation. Such checkers can be assertions embedded in the design or the testbench. They can also be any code that uses values for a small set of signals in the design to achieve a specific purpose. Note that this step is optional and the signals can be provided directly by the user.

In (1), when extracting signals, the computer executable tool analyzes the design and distinguish signals that are used as clocks from those that are used as data. Signals that are used as clocks are not monitored during emulation and their values are not saved. Only signals that are used as data are monitored during emulation with their values saved.

(2) A synthesizable signal monitor (160) is generated (140) to collect values for signals extracted (135) in the first step. The monitor can be implemented by creating a counter that counts the number of clocks for the monitored signals. Whenever there is any value change on any of the monitored signals, the clock count along with current values are sent to the emulation control system. The system then writes (145) the values into a database (165). Another implementation of the monitor can be to partition the monitored signals into several smaller sets where signals in each set are logically close. A FIFO is created for each set and records clock count and signal values in the set whenever there are signal value changes in the set. When the FIFO is full, its saved data are then sent to the emulator control system for saving into a database. Note that these two implementations are meant to be used as examples only and any implementation that achieves the same goal can be used.

(3) The signal monitor is synthesized and emulated with the rest of the design. During emulation, all value changes will be saved to a database by the emulator control system.

(4) The system then reads the database and uses logic simulation to replay (150) the values saved in the database on the whole design code including checkers. The checkers can then perform their intended tasks using the values. To improve performance, signals not used in the checkers are forced to constant values so that they will not change. This prevents simulators from performing unneeded tasks that evaluate value changes in downstream logic of the signals and can reduce runtime. Not changing the design code for the purpose of replay makes logic replay much easier to setup.

In this example, emulator is used as an example system but other hardware-accelerated simulation methods such as accelerator can be used without departing from the essence of methods presented in this invention. The use of emulation is an example implementation of the presented invention but does not limit this invention to these implementations.

Figure 2:
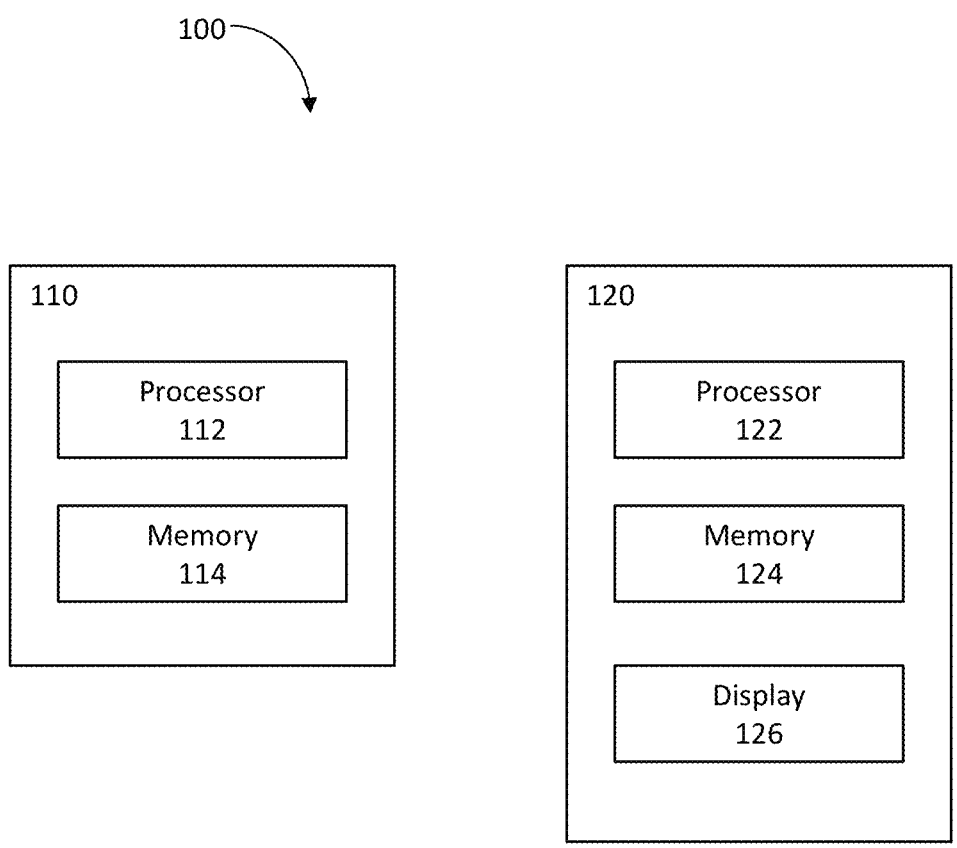
FIG. 2 is a block diagram of a system for implementing the processes and/or subprocesses described above according to aspects of the disclosure, for example the flow chart of FIG. 1.

FIG. 2 is a block diagram of a system 100 for implementing the processes and/or subprocesses described above according to aspects of the disclosure, for example the flow chart of FIG. 1. As shown, the system 100 may include a computing device 110 and a client computing device 120.

The computing device 110 may include at least one processor 112, at least one memory 114, and any other components typically present in general purpose computers. The memory 114 may store information accessible by the processor 112, such as instructions that may be executed by the processor or data that may be retrieved, manipulated, or stored by the processor. The memory 114 and/or processor 112 can be programmed to carry out a set of logical or arithmetic operations. In one example, the logical or arithmetic operations may be stored on a non-transitory computer readable medium. The processor obtains information from memories, performs logical or arithmetic operations based on programmed instructions, and stores the results of the operations into memories. Although FIG. 2 illustrates processor 112 and memory 114 as being within the same block, it is understood that the processor 112 and memory 114 may respectively comprise one or more processors and/or memories that may or may not be stored in the same physical housing. In one example, computer 110 may be a server that communicates with one or more client devices 120, directly or indirectly, via a network (not shown). The computing device 110 can interact with users through input and output devices (not shown), such as keyboards, mouses, disks, networks, displays and printers.

The client computing device 120 may be configured similarly to the computer 110, such that it may include processor 122, a memory 124, and any other components typically present in a general purpose computer. The client device 120 may be any type of computing device, such as a personal computer, tablet, mobile phone, laptop, PDA, etc. In this example, the client device 120 may also include a display 126, such as an LCD, plasma, touch screen, or the like.

The computer executable processing component described in the present disclosure can be executed by the processor(s) of one or more computing devices, such as computing device 110 and/or client computing device 120, or any other computing device.

The foregoing has been a detailed description of illustrative embodiments of the invention. Various modifications and additions can be made without departing from the spirit and scope of this invention. Features of each of the various embodiments described above can be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. Accordingly, this description is meant to be taken only by way of example, and not to otherwise limit the scope of this invention. Moreover, while particular arrangements of applications, computers, simulators, and other simulation environment elements are shown, the arrangements are highly variable and can be all disposed within a single server or computing device, or the applications can be spread over a variety of servers as appropriate and within ordinary skill. Moreover, a depicted process or processor can be combined with other processes and/or processors or divided into various sub-processes or processors. Such sub-processes and/or sub-processors can be variously combined according to embodiments herein. Likewise, it is expressly contemplated that any function, process and/or processor herein can be implemented using electronic hardware, software consisting of a non-transitory computer-readable medium of program instructions, or a combination of hardware and software. Accordingly, this description is meant to be taken only by way of example, and not to otherwise limit the scope of this invention.

What is claimed is:

1. A method for replaying collect values on checkers, comprising:
   receiving one or more design circuit signals used in checkers;
   monitoring the one or more design circuit signals to collect one or more values by generating a counter in an emulator that counts a number of clocks for the monitored one or more signals;
   identifying a change in value associated with the monitored one or more design circuit signals in the emulator;
   writing the changed design circuit signal value and the associated clock count in the emulator in a signal value database; and
   replaying the changed values from the signal value database using logic simulation on the checkers.

2. The method of claim 1, wherein the one or more design circuit signals are extracted.

3. The method of claim 1, wherein the checkers comprise assertions embedded in a design circuit or a testbench.

4. The method of claim 2, further comprising:
   during extraction of the one or more design circuit signals, analyzing a design circuit; and
   distinguishing clock signals from data signals.

5. The method of claim 2, further comprising: during replaying of the changed values, force signals not used by the checkers to constants.

6. A system for replaying collect values on checkers, comprising:
   a memory having program instructions stored thereon; and
   a processor configured to:
      receive one or more design circuit signals used in checkers;
      monitor the one or more design circuit signals to collect one or more values by generating a counter in an emulator that counts a number of clocks for the monitored one or more signals;
      identify a change in value associated with the monitored one or more design circuit signals in the emulator;
      write the changed design circuit signal value and the associated clock count in the emulator in a signal value database; and
      replay the changed values from the signal value database using logic simulation on the checkers.

7. The system of claim 6, wherein the one or more design circuit signals are extracted.

8. The system of claim 6, wherein the checkers comprise assertions embedded in a design circuit or a testbench.

9. The system of claim 7, wherein the processor is further configured to:
   during extraction of the one or more design circuit signals, analyze a design circuit; and
   distinguish clock signals from data signals.

10. The system of claim 7, wherein the processor is further configured to:
    during replaying of the changed values, force signals not used by the checkers to constants.

11. A non-transitory computer readable medium containing program instructions for causing a computer to perform the method of:
    receiving one or more design circuit signals used in checkers;
    monitoring the one or more design circuit signals to collect one or more values by generating a counter in an emulator that counts a number of clocks for the monitored one or more signals;
    identifying a change in value associated with the monitored one or more design circuit signals in the emulator;
    writing the changed design circuit signal value and the associated clock count in the emulator in a signal value database; and
    replaying the changed values from the signal value database using logic simulation on the checkers.

12. The system of claim 11, wherein the one or more design circuit signals are extracted.

13. The system of claim 11, wherein the checkers comprise assertions embedded in a design circuit or a testbench.

14. The system of claim 12, further comprising:
    during extraction of the design circuit one or more signals, analyzing a design circuit; and
    distinguishing clock signals from data signals.

15. The system of claim 12, further comprising: during replaying of the changed values, force signals not used by the checkers to constants.

* * * * *